United States Patent
Lee et al.

(10) Patent No.: US 7,338,867 B2
(45) Date of Patent: Mar. 4, 2008

(54) SEMICONDUCTOR DEVICE HAVING CONTACT PADS AND METHOD FOR MANUFACTURING THE SAME

(75) Inventors: Deok-Hyung Lee, Gyeonggi-do (KR); Si-Young Choi, Gyeonggi-do (KR); Byeong-Chan Lee, Gyeonggi-do (KR); Chul-Sung Kim, Gyeonggi-do (KR); In-Soo Jung, Gyeonggi-do (KR); Jong-Ryeol Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 749 days.

(21) Appl. No.: 10/747,925

(22) Filed: Dec. 30, 2003

(65) Prior Publication Data

US 2004/0161884 A1 Aug. 19, 2004

(30) Foreign Application Priority Data

Feb. 17, 2003 (KR) ...................... 10-2003-0009916

(51) Int. Cl.
*H01L 21/336* (2006.01)
*H01L 21/4763* (2006.01)

(52) U.S. Cl. ...................... 438/279; 438/283; 438/285; 438/287; 257/E21.507; 257/E21.589

(58) Field of Classification Search ................ 438/279, 438/283, 285, 287, 288; 257/E21.507, E21.589, 257/E21.649, E21.657, E21.658
See application file for complete search history.

(56) References Cited

U.S. PATENT DOCUMENTS

| | | | |
|---|---|---|---|
| 2004/0021225 A1* | 2/2004 | Park et al. | ................... 257/758 |
| 2004/0188745 A1* | 9/2004 | Kim et al. | ................... 257/306 |
| 2005/0199920 A1* | 9/2005 | Lee et al. | ................... 257/288 |
| 2005/0239279 A1* | 10/2005 | Park et al. | ................... 438/618 |
| 2006/0006410 A1* | 1/2006 | Lee et al. | ................... 257/145 |
| 2006/0258145 A1* | 11/2006 | Lee et al. | ................... 438/618 |

FOREIGN PATENT DOCUMENTS

| | | |
|---|---|---|
| KR | 1020000066155 | 11/2000 |
| KR | 1020010077098 | 8/2001 |
| KR | 2002-0053542 | 7/2002 |
| KR | 1020020053542 | 7/2002 |
| WO | WO 00/11712 | 3/2000 |

OTHER PUBLICATIONS

Korean Office Action, for Korean Application No. 10-2003-0009916.

* cited by examiner

*Primary Examiner*—Walter Lindsay, Jr.
(74) *Attorney, Agent, or Firm*—Myers Bigel Sibley & Sajovec

(57) ABSTRACT

Semiconductor devices have gate structures on a semiconductor substrate with first spacers on sidewalls of the respective gate structures. First contact pads are positioned between the gate structures and have heights lower than the heights of the gate structures. Second spacers are disposed on sidewalls of the first spacers and on exposed sidewalls of the first contact pads. Second contact pads are disposed on the first contact pads.

32 Claims, 17 Drawing Sheets

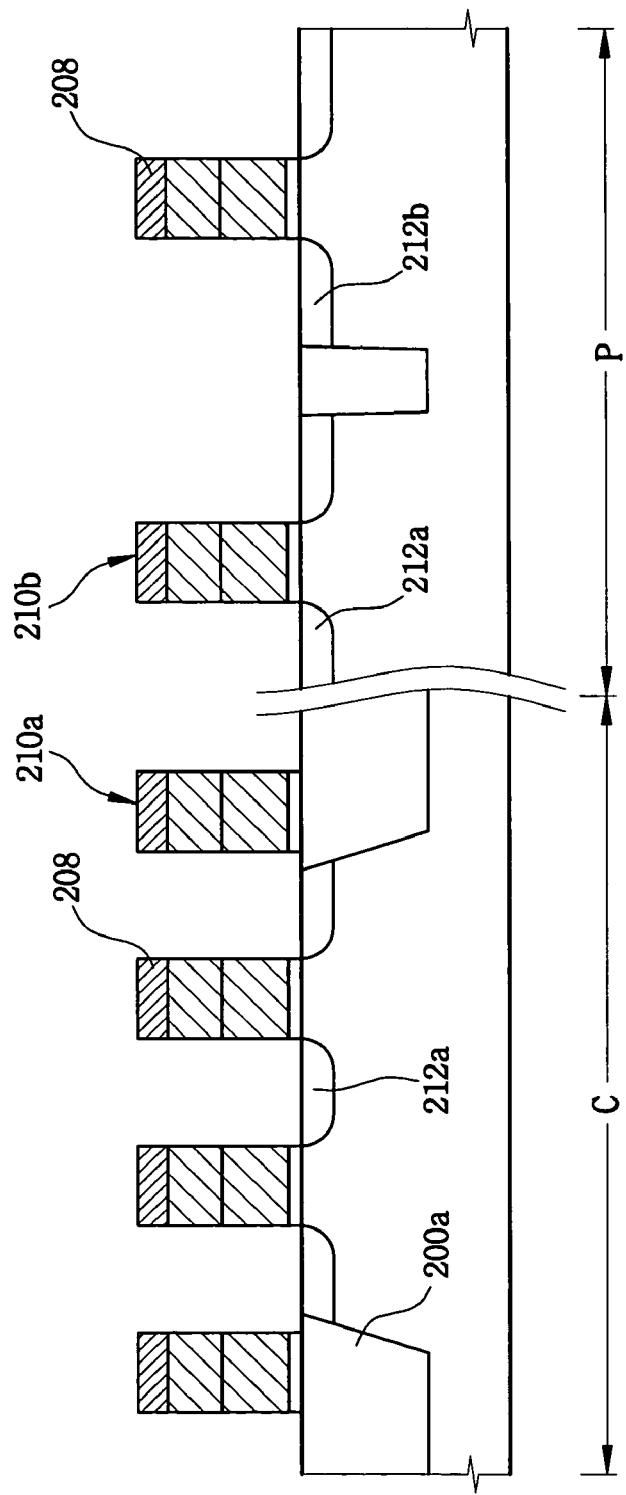

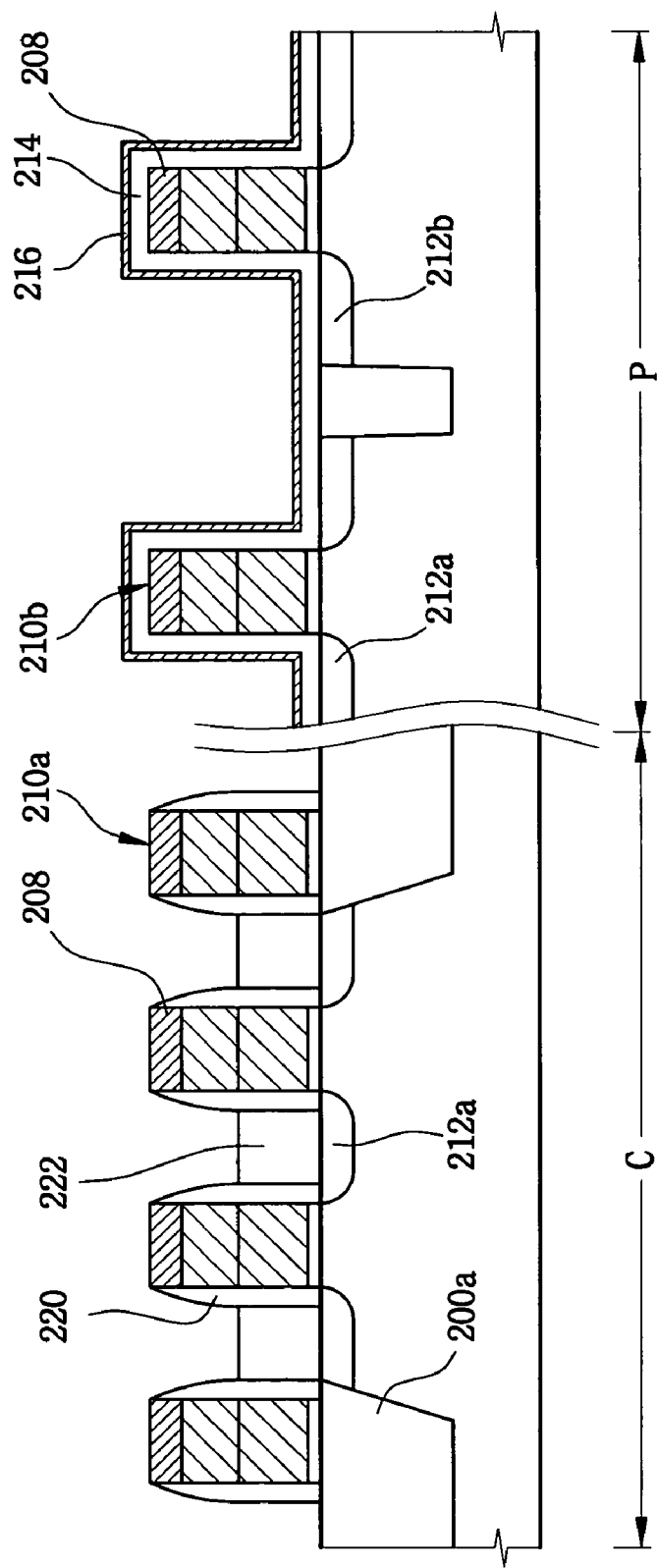

SEMICONDUCTOR DEVICE HAVING CONTACT PADS AND METHOD FOR MANUFACTURING THE SAME

CROSS REFERENCE TO RELATED APPLICATIONS

This application claims priority under 35 U.S.C. § 119 to Korean Patent Application No. 2003-9916, filed Feb. 17, 2003, the contents of which are incorporated herein in its entirety by reference.

FIELD OF THE INVENTION

The present invention relates to contact pads for semiconductor devices and, more particularly, to semiconductor devices having small contact pads and methods for manufacturing such devices.

BACKGROUND OF THE INVENTION

As semiconductor devices become more highly integrated, the widths of wirings and intervals between the wirings on these device have been greatly reduced. The size of structures grown on the devices and the dimensions of bit lines have also been greatly reduced.

Contacts are highly conductive films that connect isolated regions of a device. Semiconductor contacts may occupy considerable portions of the semiconductor device because the contacts typically require both an alignment margin and an isolation margin. As a result, the size of the contact may become one of main factors that determine the size of a cell in a semiconductor memory device, such as a DRAM device.

Conventional methods for forming a contact typically cannot be used to form a very small contact. Moreover, with semiconductor memory devices that include a plurality of conductive films, interlayer dielectrics are generally interposed between the conductive films which makes forming the contact more difficult because a vertical interval between the conductive films is very large. To address these difficulties, a method for forming a contact using a self-aligned process has been developed in order to provide semiconductor memory devices having reduced cell sizes.

Generally, when forming a self-aligned contact, the contact size is varied based on the heights of the adjacent structures, the thickness of the insulation film where the contact is formed, and the etching process used to form the contact. Contacts formed using the self-aligned contact method may be smaller than contacts formed using a conventional process because the self-aligned contacts do not require an alignment margin. The method for forming the self-aligned contact is generally performed using the etching selectivity between an oxide film and a nitride film and by employing an anisotropic etching process.

Unfortunately, when a contact pad that contacts a source/drain region between gate electrodes is formed using the self-aligned process, nitride spacers that are formed on the sidewalls of the gate electrodes and nitride masks that are provided on the gate electrodes may be partially etched when the oxide film that is positioned between the gate electrodes is etched. The gate electrodes may be exposed during the etching of the oxide film because of shoulder margins associated with the nitride spacers and the nitride mask. As a result of this unintended etching, the gate electrodes may be connected to the contact pad, thereby causing an electrical short between the gate electrodes and the contact pad.

To prevent such an electrical short, the thickness of the nitride spacer and the thickness of the nitride mask may be increased. However, when the thickness of the nitride spacer increases, the resistance of the contact also increases because the contact area between the contact and the source/drain region decreases. In addition, when the thickness of the nitride mask increases, voids may be easily generated in the oxide film because the gap between the gate electrodes may be completely filled by the oxide film.

A method for forming a contact pad at exposed portions of a silicon substrate between gate electrodes has been suggested in which silicon contact pads are grown using a selective epitaxial growth process. However, the silicon contact pad grows not only along <1 0 0> crystalline direction that is perpendicular to the substrate, but also along <110> crystalline direction that is parallel to the substrate. Thus, when this method is used, adjacent contact pads may become connected to each other to generate an electrical short.

To overcome this problem, an insulation film may be formed between epitaxially grown films in order to insulate the epitaxially grown films from one another after the epitaxially grown films are selectively formed on the substrate to have limited dimensions along a direction parallel to the substrate. Korean Patent Laid Open Publication No. 2002-53542 discloses a method for forming a secondarily epitaxially grown film selectively on the above-mentioned epitaxially grown films. However, the insulation film may hardly form between the epitaxially grown films, and even when the insulation film exists on the epitaxially grown films, the secondarily epitaxially grown film may not be formed on the epitaxially grown films. If the insulation film is over-etched to prevent the above-mentioned problem, upper portions of the epitaxially grown films are exposed such that they may not prevent horizontal growth of the silicon during the formation of the secondarily epitaxially grown film.

SUMMARY OF THE INVENTION

In accordance with embodiments of the present invention, a semiconductor device includes gate structures, first spacers, first contact pads, second spacers, and second contact pads. The gate structures are disposed on a semiconductor substrate having an active region and a field region. The first spacers are disposed on sidewalls of the gate structures. The first contact pads are disposed on portions of the active region positioned between the gate structures, where the height of the first contact pads is less than the height of the gate structures. The second spacers are disposed between adjacent first contact pads, and may also be disposed on sidewalls of the first spacers. A second contact pad is disposed on each first contact pad. The device may also include a metal silicide layer such as a cobalt silicide, titanium silicide and/or nickel silicide layer on each of the second contact pads.

In certain embodiments of the present invention, the height of the first contact pads and/or the second spacers above the substrate may be between about 30 percent and 60 percent of the height above the substrate of the adjacent gate structures. The first contact pads and/or the second contact pads may be formed of silicon doped with impurities or silicon germanium doped with impurities. The first spacer and/or the second spacer may comprise a silicon oxide and/or silicon nitride film, and the thickness of the first spacer may be from about 50 Å to about 300 Å while the thickness of the second spacer may be from about 50 Å to about 100 Å.

Pursuant to further embodiments of the invention, semiconductor devices having a substrate having a plurality of active regions in both a cell area and a peripheral circuit area are provided. In these devices a plurality of cell gate structures are disposed on the cell area and a plurality of peripheral gate structures are disposed on the peripheral circuit area. A first spacer is disposed on at least some of the sidewalls of the cell gate structures, and an insulation film pattern is disposed on the peripheral gate structures. A plurality of first semiconductor contact pads are positioned between the cell gate structures on the active regions, and a second spacer is disposed on the sidewalls of at least some of the first spacers, the first semiconductor contact pads, and the insulation film pattern. A second semiconductor contact pad may be disposed on each of the first semiconductor contact pads and a plurality of third semiconductor contact pads may be disposed on the active regions of the peripheral circuit area. Moreover, the cell gate structures may have a first height above the substrate, while the first contact pads have a second height that is less than the first height. Methods of forming such a device are also provided.

According to additional embodiments of the present invention, a semiconductor device is manufactured by forming a pair of gate structures having opposed sidewalls on a semiconductor substrate. A first spacer is formed on the opposed sidewalls of the pair of gate structures, and a plurality of first contact pads are formed on the substrate between the pair of gate structures such that the height above the substrate of each first contact pad is less than the height above the substrate of the pair of gate structures. A second spacer is formed on at least some of the opposing sidewalls of the first contact pads, and a second contact pad is formed on at least some of the first contact pads and may also be formed between the pair of gate structures and the first contact pads.

The first contact pads and the second contact pads may be formed by growing semiconductor materials using a selective epitaxial growth process. The first contact pads and/or the second contact pads may be formed of silicon doped with impurities or silicon germanium doped with impurities. The first contact pads and/or the second contact pads may be doped by introducing a dopant gas in-situ during growth and/or by an ion implantation process. The first contact pads may be from about 30 percent to 60 percent of the height above the substrate of the pair of gate structures.

The first spacers and/or the second spacers may comprises a silicon oxide or silicon nitride film. The first spacer may have a thickness of from about 50 Å to about 300 Å while the second spacer may have a thickness of from about 50 Å to about 100 Å. The first contact pads may be formed to a predetermined height to reduce and/or prevent horizontal growth of the first contact pads forming an electrical short between one or more adjacent first contact pads. The second spacer may reduce and/or minimize horizontal growth of the second contact pads during the selective epitaxial growth process used to form the second contact pads. Also, a metal silicide layer may be selectively formed on the second contact pads. Further, each of the pair of gate structures may include a relatively thin hard mask layer that does not provide a shoulder margin.

BRIEF DESCRIPTION OF THE DRAWINGS

FIGS. 9A to 9I are cross-sectional views illustrating methods for manufacturing semiconductor devices according to still further embodiments of the present invention.

DETAILED DESCRIPTION

Figure 1:
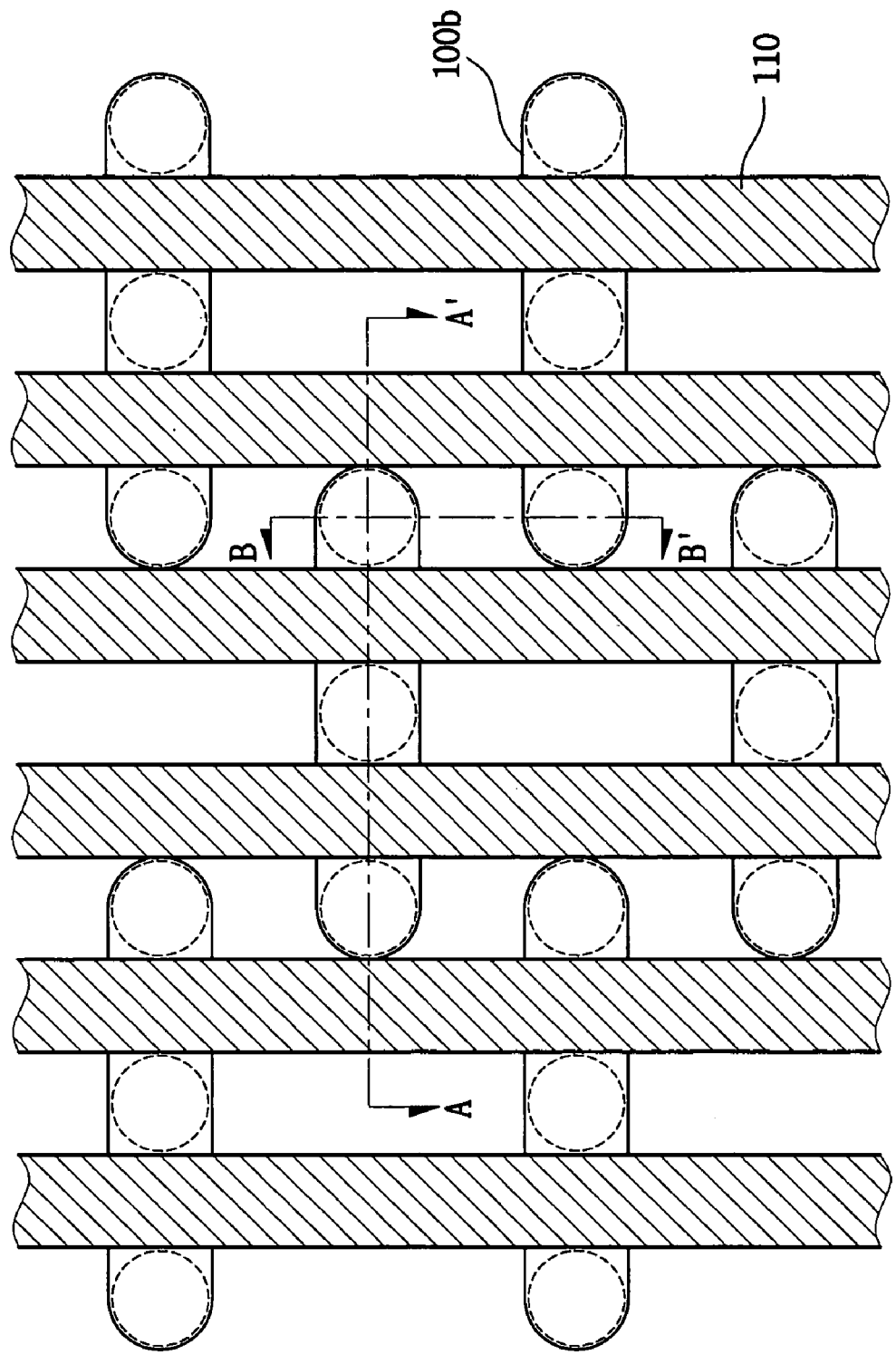
FIG. 1 is a plan view illustrating semiconductor devices having a contact pad according to embodiments of the present invention.

The present invention will now be described more fully with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when a layer is referred to as being "directly on" another layer, there are no intervening layers present. Likewise, when an element is described as being "between" two other elements it may be the only element between the two other elements or additional elements may also be present. Like reference numerals refer to like elements throughout.

Figure 2A:
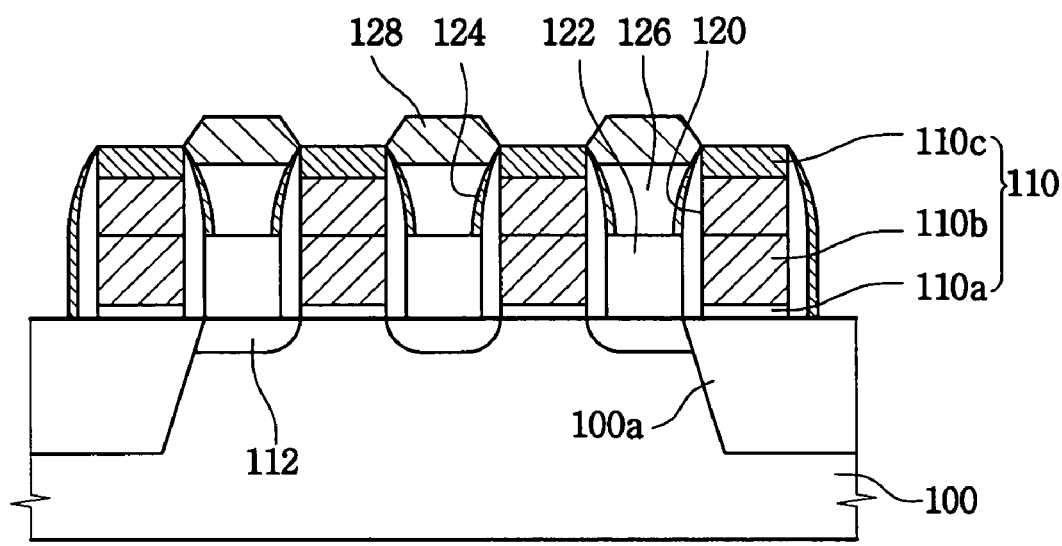
FIG. 2A is a cross-sectional view of the semiconductor devices of FIG. 1 taken along the line A-A' in FIG. 1.
Figure 2B:
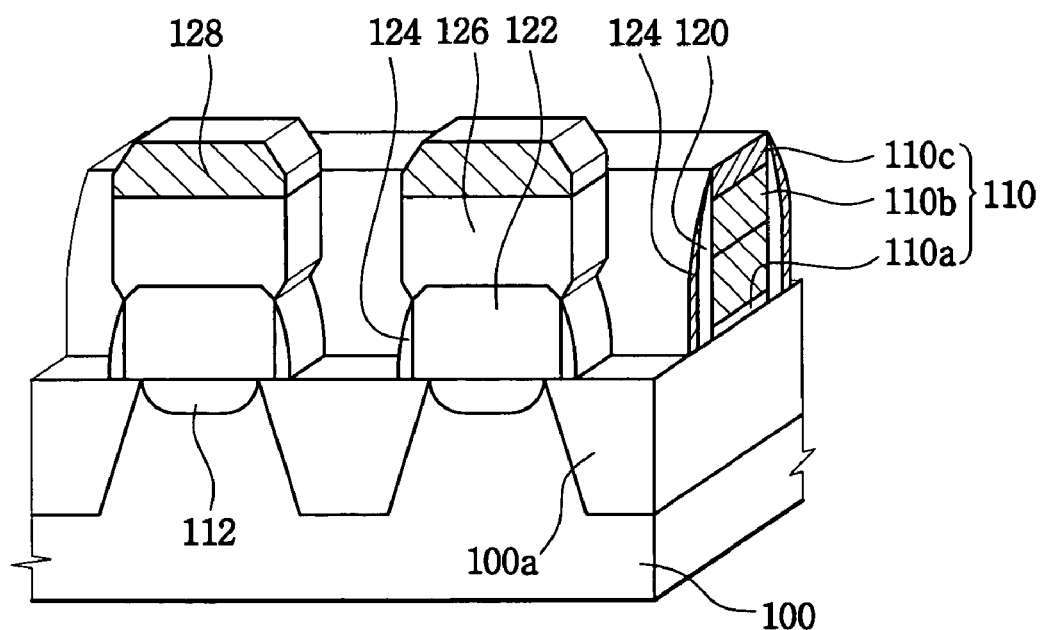
FIG. 2B is a perspective cross-sectional view of the semiconductor devices of FIG. 1 taken along the line B-B' in FIG. 1.

FIG. 1 is a plan view illustrating semiconductor devices having a contact pad according to embodiments of the present invention. FIG. 2A is a cross-sectional view illustrating the semiconductor device of FIG. 1 taken along the line A-A' of FIG. 1. FIG. 2B is a perspective cross-sectional view illustrating the semiconductor devices of FIG. 1 taken along the line B-B' of FIG. 1.

Referring to FIGS. 1, 2A and 2B, gate structures 110 are formed on a semiconductor substrate 100. An active region 100b and a field region 100a are defined in the substrate 100. Each of the gate structures 110 includes a gate oxide film pattern 110a, a gate pattern 110b and a hard mask pattern 110c. Source/drain regions 112 are formed at portions of the semiconductor substrate 100 between the gate structures 110.

First spacers 120 may be formed on each sidewall of the gate structures 110. The first spacers 120 include an insulation material like silicon oxide or silicon nitride. The first spacers 120 insulate the gate structures 110 from contact pads that are successively formed between the gate structures 110. The thickness of the first spacers 120 may be selected based on the insulation characteristics of the material used to form the first spacers 120 and contact areas of the contact pads relative to the substrate 100. In embodiments of the present invention, the first spacers 120 have a thickness of about 50 Å to about 300 Å, although other thicknesses may also be used.

First contact pads 122 are formed at portions of the active region 100b between the gate structures 110. The height of each of the first contact pads 122 may be less than the height of the gate structures 110. The first contact pads 122 are formed such that they do not cause an electrical short between adjacent first contact pads 122 when the first contact pads 122 are grown along a crystalline direction that is parallel to the substrate 100. For instance, each first contact pad 122 may have a height that is lower than the height of the gate structure 110 by from about 30 to about 60 percent. The first contact pad 122 may, for example, be a semiconductor material such as polysilicon doped with impurities or silicon germanium doped with impurities.

Second spacers 124 are formed on sidewalls of the first spacers 120 that are positioned on the first contact pads 122. Second spacers 124 may also be formed on sidewalls of the first contact pads 122 adjacent to the field region 100a. The second spacers 124 formed on the sidewalls of the first spacers 120 may have heights higher than the second spacers 124 formed on the sidewalls of the first contact pads 122 because the heights of the first contact pads 122 may be lower than the heights of the first spacers 120. In certain embodiments, the second spacers 124 may be formed of silicon oxide or silicon nitride. Because second spacers 124 are formed on the sidewalls of the first contact pads 122, semiconductor materials that are grown using exposed surfaces of the first contact pads 122 as seeds cannot grow in the horizontal direction. In certain embodiments, the second spacers 124 may have a thickness of from about 50 Å to about 100 Å, although other thicknesses may also be used.

Second contact pads 126 are formed on the first contact pads 122. In certain embodiments, the second contract pads 126 may be formed from semiconductor materials that are identical to the semiconductor materials used to form the first contact pads 122, such as polysilicon doped with impurities or silicon germanium doped with impurities.

As shown in FIGS. 2A and 2B, metal silicide patterns 128 may be selectively formed on the second contact pads 126. The metal silicide patterns 128 may be, for example, formed of cobalt silicide, titanium silicide, nickel silicide or other appropriate materials.

FIGS. 3A to 7B are cross-sectional views and perspective cross-sectional views illustrating methods for manufacturing the semiconductor device shown in FIGS. 1, 2A and 2B according to embodiments of the present invention. FIGS. 3A, 4A, 5A, 6A and 7A are cross-sectional views taken along the axis defined by line A-A' in FIG. 1. FIGS. 3B, 4B, 5B, 6B and 7B are perspective cross-sectional views taken along the axis defined by line B-B' in FIG. 1.

Figure 3A:
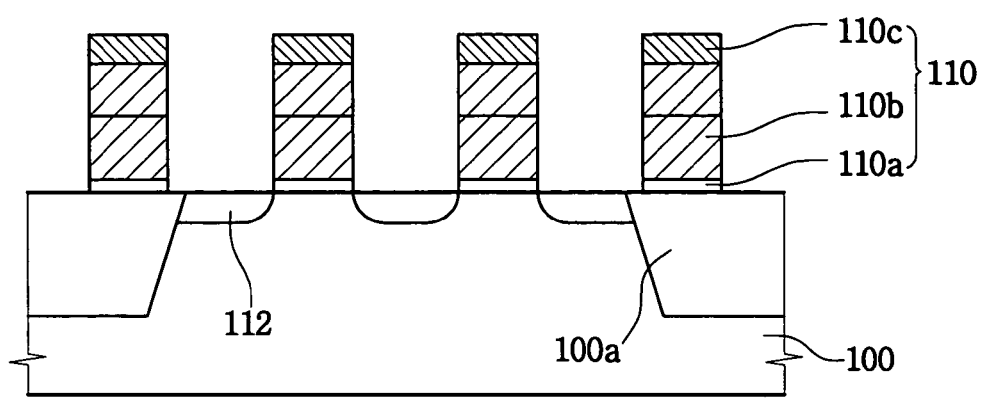
FIGS. 3A to 7B are cross-sectional views and perspective cross-sectional views illustrating methods for manufacturing the semiconductor devices shown in FIGS. 1, 2A and 2B.
Figure 3B:
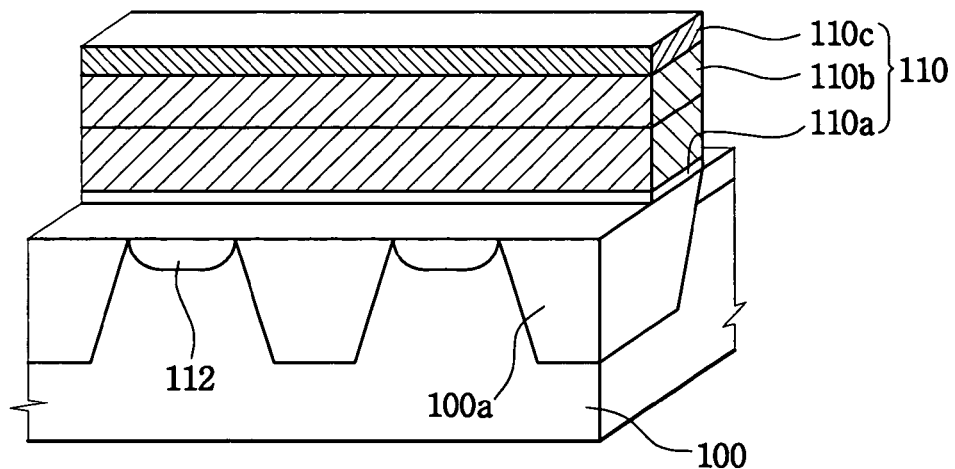

Referring to FIGS. 3A and 3B, with an isolation process like a shallow trench: isolation (STI) process, an active region and a field region 100a are defined on a semiconductor substrate 100 composed of single crystal silicon. For instance, a pad oxide film, a nitride film and a high temperature oxide (HTO) film may be successively formed on the semiconductor substrate 100. After an anti-reflection layer (ARL) composed of silicon oxynitride (SiON) is formed on the HTO film, a photolithography process that defines active patterns may be performed to pattern the HTO film. The nitride film and the pad oxide film may then be etched using the HTO film patterns to form nitride film patterns and pad oxide film patterns. Then, the substrate 100 is partially etched to form trenches having predetermined depths. An oxide film may then be formed using a chemical vapor deposition (CVD) process to fill up the trenches. Therefore, the oxide film may be etched using a chemical-mechanical polishing (CMP) process until the nitride film patterns are exposed, thereby forming field oxide films in the trenches. The nitride film patterns may then be removed through a stripping process using phosphoric acid.

Next, gate structures 110 may be formed on the substrate 100. This may be accomplished by forming a gate oxide film on the substrate 100 to a thickness of, for example, from about 30 Å to about 100 Å. Next, a gate electrode layer comprising a polysilicon film and a metal silicide film is formed on the gate oxide film. Then, a hard mask layer comprising nitride is formed on the gate electrode layer. The hard mask layer can have a thickness that is, for example, less than half the thickness of the conventional hard masks that are used for forming a contact pad using the self-align process discussed above.

In the conventional method for forming a contact pad, a thick hard mask is used in order to ensure that the contact hole has a shoulder margin when the contact hole is formed using the self-aligned process. However, according to the embodiments of the present invention depicted in FIGS. 3A through 7A and 3B through 7B, self-aligned contact hole is not required when the contact pads are formed. As a result, the shoulder margin of the contact hole need not be considered during formation of the contact pads. Accordingly, the hard mask layer may have a thickness that is substantially less than the thickness of a conventional hard mask. The hard mask layer, the gate electrode layer and the gate oxide film are successively etched, thereby forming the gate structures 110 including gate oxide patterns 110a, gate patterns 110b and hard mask patterns 110c. The height of the gate structure 110 may: be reduced given the reduction in the thickness of the hard mask pattern 110c.

Source/drain regions 112 are formed by implanting impurities into portions of the substrate 100 that are exposed between the gate structures 110 using the gate structures 110 as masks.

Figure 4A:
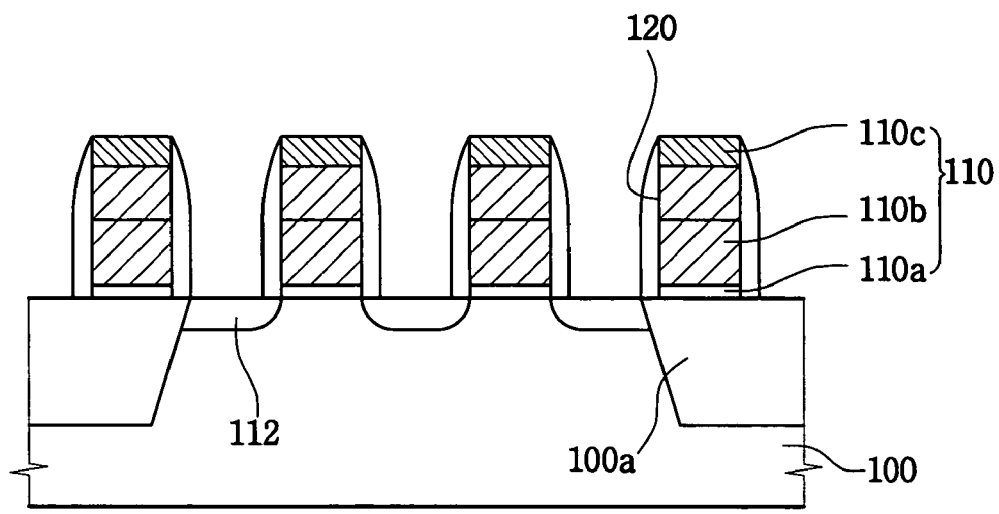
Figure 4B:
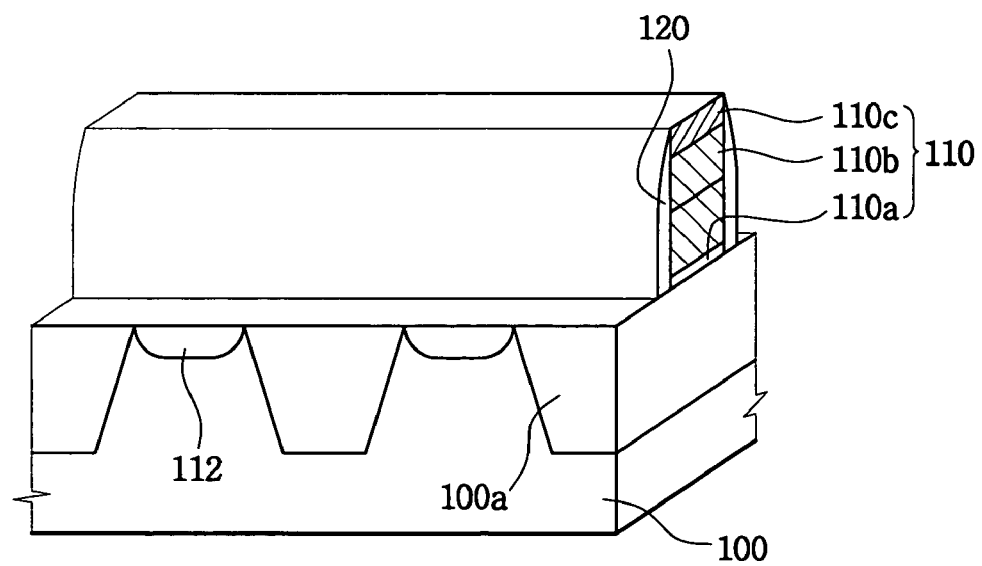

Next, an insulation film may be formed on the gate structures 110 and on the substrate 100 as shown in FIGS. 4A and 4B. The insulation film may be anisotropically etched to form first spacers 120 on the sidewalls of the gate structures 110. As discussed above, in certain embodiments the insulation film used to form the first spacers 120 may be silicon oxide and/or silicon nitride. The first spacers 120 insulate the gate structures 110 from the contact pads that are successively formed between the gate structures 110. As such, the first spacers 120 should reduce and/or minimize formation of parasitic capacitance between the gate structures 110 and the contact pads. When the first spacers 120 are grown thicker in order to reduce the formation of the parasitic capacitances, the contact area between each contact pad and the substrate 100 decreases and the resistance of the contact pad increases accordingly. In certain embodiments of the present invention, the first spacers 120 may have a thickness of from about 50 521 to about 300 Å.

Figure 5A:
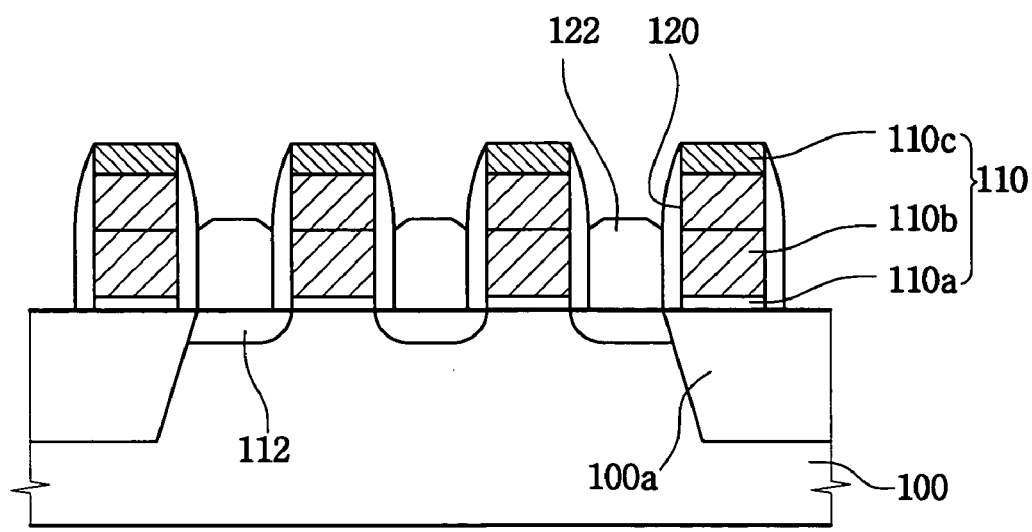
Figure 5B:
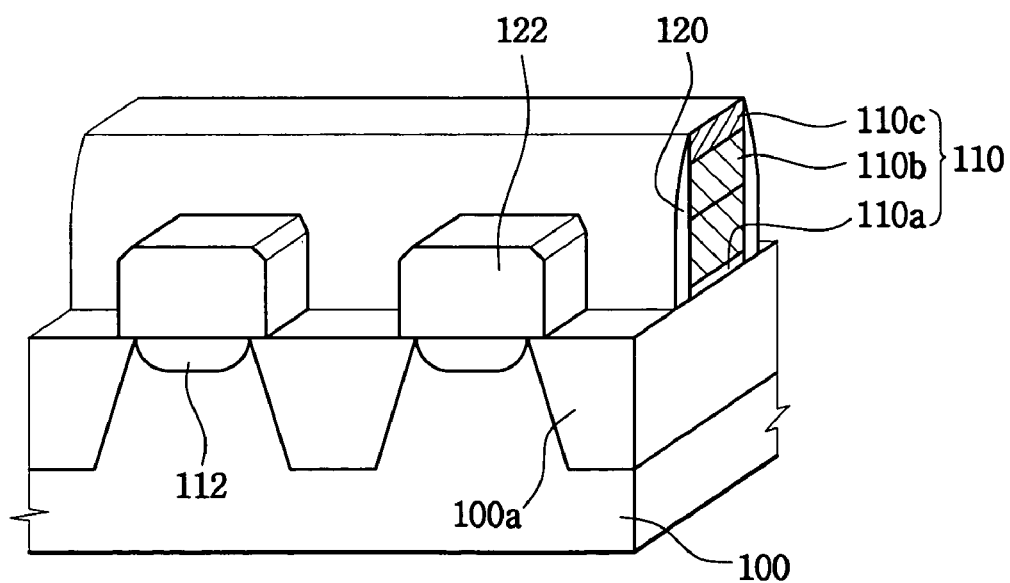

Referring to FIGS. 5A and 5B, the first contact pads 122 are formed on portions of the active regions of the substrate exposed between the gate structures 110. The first contact pads 122 may be formed of semiconductor materials grown by a selective epitaxial growth process. The first contact pads 122 contact the respective source/drain regions 112. Moreover, each of the first contact pads 122 may have a height that is lower than the height of the adjacent gate structure 110. The first contact pads 122 may comprise, for example, silicon doped with impurities or silicon germanium doped with impurities.

In embodiments of the present invention, the first contact pads 122 are silicon doped with impurities and may be formed as follows. A silicon layer is epitaxially grown on the surfaces of the semiconductor substrate 100 between the gate structures 110 using the silicon of the substrate 100 as the seed material. Impurities are doped in-situ into the epitaxially grown silicon during the epitaxial growth process. The silicon may be grown via an ultrahigh vacuum chemical vapor deposition (UHVCVD) process using a disilane ($Si_2H_6$) gas or a monosilane ($SiH_4$) gas as a source gas. A chlorine ($Cl_2$) gas may additionally be added in order to prevent growth of the silicon relative to the field oxide film of the field region 110a, the nitride hard mask patterns 110c and the first spacers 120. When the impurities are doped into the silicon first contact pads 122 the contact pads are electrically conductive.

When the first contact pads 122 are grown in accordance with the above-described process, the silicon first contact pads 122 grow along the <1 0 0> crystalline direction, which is perpendicular to the orientation of the silicon substrate 100. The silicon first contact pads 122 also grow along the <110> crystalline direction, which is parallel to the orientation of the silicon substrate 100. This growth process may cause adjacent first contact pads 122 to become connected, resulting in an electrical short, because the silicon first contact pads 122 grow in both a vertical and horizontal direction centering around the field region 100a. By forming the first contact pads 122 so that they have a height that is lower than the height of the gate structures 110, the first contact pads 122 may be grown so that adjacent pads 122 are not connected with each other. The height of the first contact pads 122 are determined based on the; integration density of the first contact pads 122 and the heights of the gate structures 110. According to some embodiments of the present invention, the first contact pads 122 may have a height lower than the height of the gate structures 110 by about 30 to about 60 percent.

Figure 6A:
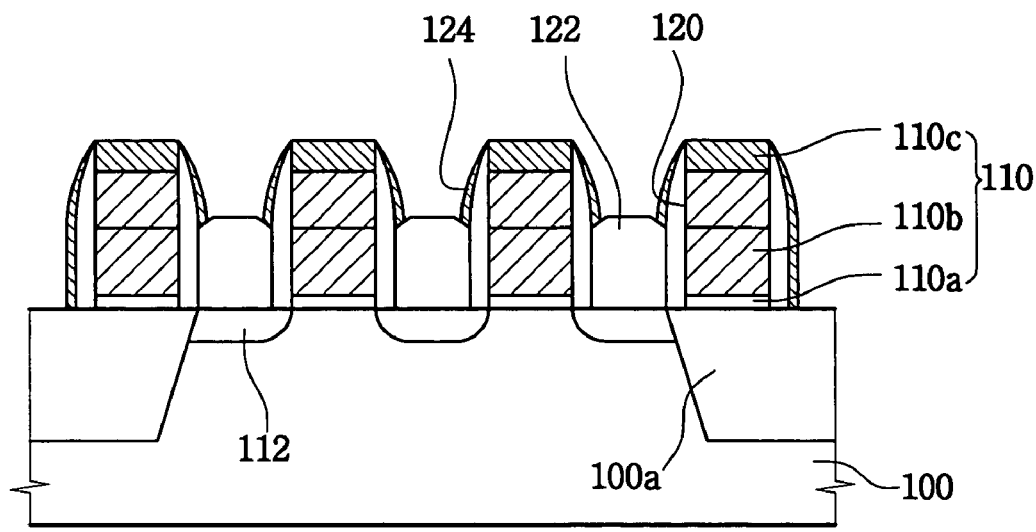
Figure 6B:
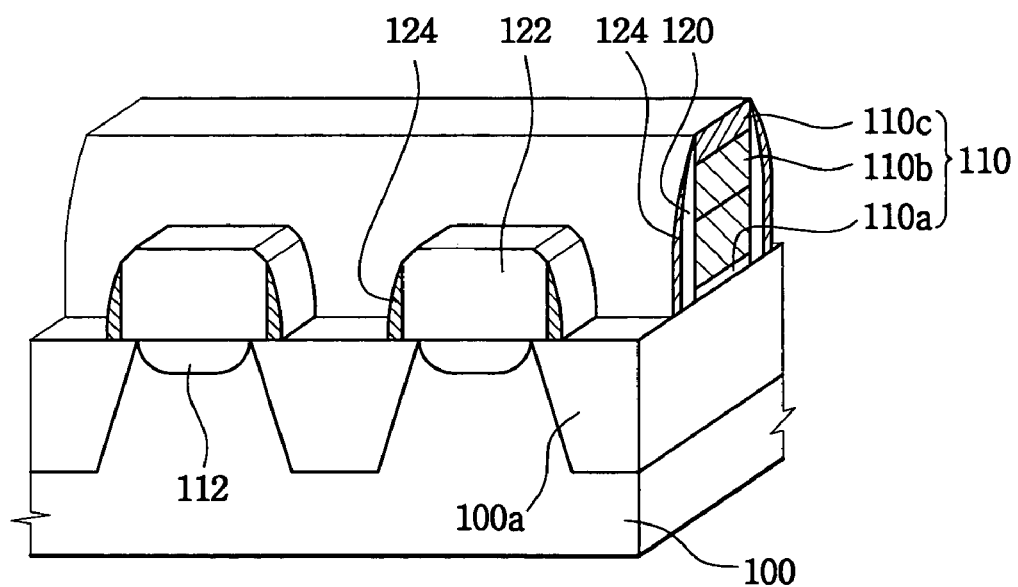

Referring to FIGS. 6A and 6B, an insulation film (not shown) is formed on the substrate 100 having the first contact pads 122 formed thereon. The insulation film is anisotropically etched to form second spacers 124 on sidewalls of the first spacers 120 and on sidewalls of the first contact pads 122. The second spacers 124 may be formed of an insulation material such as silicon oxide and/or silicon nitride. Because the second spacers 124 are formed on the sidewalls of the first contact pads 122, the semiconductor materials that form the second contact pads 126 (discussed below) will not grow in the horizontal direction when the second contact pads 126 are grown using the exposed first contact pads 122 as seeds. The second spacers 124 may have a thickness, for example, of from about 50 Å to about 100 Å.

Figure 7A:
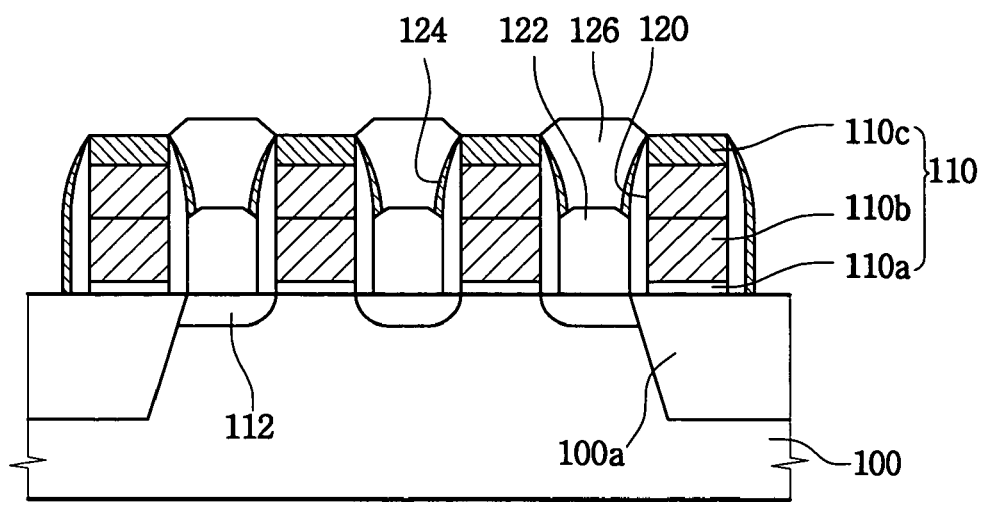
Figure 7B:
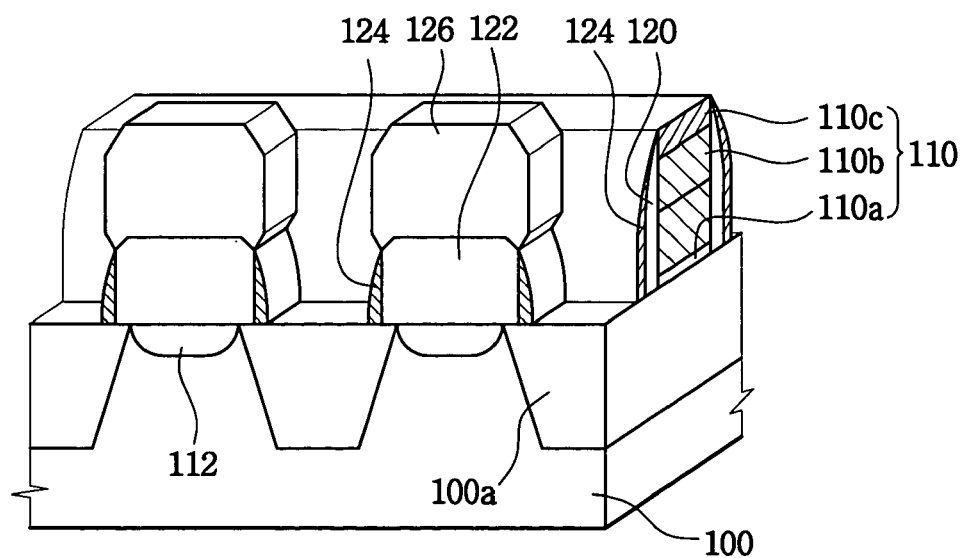

Referring to FIGS. 7A and 7B, semiconductor material is grown on the first contact pads 122 using an epitaxial growth process to form second contact pads 126 on the first contact pads 122. The combined height of the stacked first and second contact pads 122, 126 is equal to or greater than the height of the adjacent gate structures 110. The second contact pads 126 may be formed using the same semiconductor material used to form the first contact pads 122, (e.g., silicon doped with impurities or silicon germanium doped with impurities) thereby helping to minimize crystalline defects at the boundaries between the first contact pads 122 and the second contact pads 126.

According to embodiments of the present invention, second contact pads 126 formed of silicon doped with impurities may be formed as follows. First, silicon is epitaxially grown on the first contact pads 122 using the exposed doped silicon of the first contact pads 122 as seeds. During the epitaxial growth process impurities are doped into the silicon that forms the second contact pads 126. The impurities doped into the second contact pads 126 may be the same impurities that are doped into the first contact pads 122. The process for growing the second contact pads 126 may be the same process used to grow the first contact pads 122. Because the second spacers 124 are positioned on the sidewalls of the first contact pads 122, the second contact pads 126 grow in the vertical direction on the first contact pads 122. After the second contact pads 126 are partially grown on the first contact pads 122, the second contact pads 126 also grow in the horizontal direction. The horizontal growth rate of the silicon is lower than a vertical growth rate of the silicon, and the horizontal growth is confined by the second spacers 124 so that adjacent second contact pads 126 do not become connected with each other. As a result, the possibility of electrical shorts caused by a connection between adjacent second contact pads 126 can be reduced and/or minimized.

Metal silicide layer patterns 238 (see FIGS. 2A and 2B) may then be formed on the second contact pads 126 using any conventional process for forming a metal silicide layer. The metal silicide pattern 238 may include cobalt silicide, titanium silicide and/or nickel silicide. According to the above-described processes, the semiconductor device shown in FIGS. 2A and 2B may be fabricated.

When contact pads for the source/drain regions are formed in accordance with the above-described method, the possibility of an electrical short between gate electrodes and the contact pads that may result because of insufficient shoulder margin when forming a self-aligned contact using a conventional process may be reduced and/or minimized. Additionally, the possibility that voids may be formed between gate structures when an area between the gate structures is filled with insulation film may also be reduced and/or minimized because the gate structures of the above-described embodiments of the present invention have heights lower than the heights of conventional gate structures.

According to further embodiments of the present invention, semiconductor devices may be provided in which impurities are doped into the first and second contact pads using an ion implantation processes either in lieu of, or in addition to, the in-situ doping processes used in the exemplary embodiments described above. In these embodiments, first spacers may be formed on sidewalls of the gate structures using the processes described above with reference to FIGS. 3A to 4B. The first contact pads are formed on the exposed portions of the semiconductor substrate between the gate structures by epitaxially growing silicon on the substrate using the single crystalline silicon substrate as a seed. The first contact pads may also be formed using the processes described above with reference to FIGS. 5A and 5B except that the impurities are not doped in-situ into the first contact pads when the first contact pads are grown.

Next, using the process described above with reference to FIGS. 6A and 6B, second spacers may be formed on the sidewalls of the first spacers and on the sidewalls of the first contact pads. Then, the second contact pads may be formed on the first contact pads using a selective epitaxial growth process. The process for forming the second contact pads may be identical to the process described above with reference to FIGS. 7A and 7B, except that the impurities are not doped in-situ into the second contact pads when they are epitaxially grown on the first contact pads.

Then, impurities may be doped into the first and second contact pads using an ion implantation process to form electrically conductive first and second contact pads.

Figure 8:
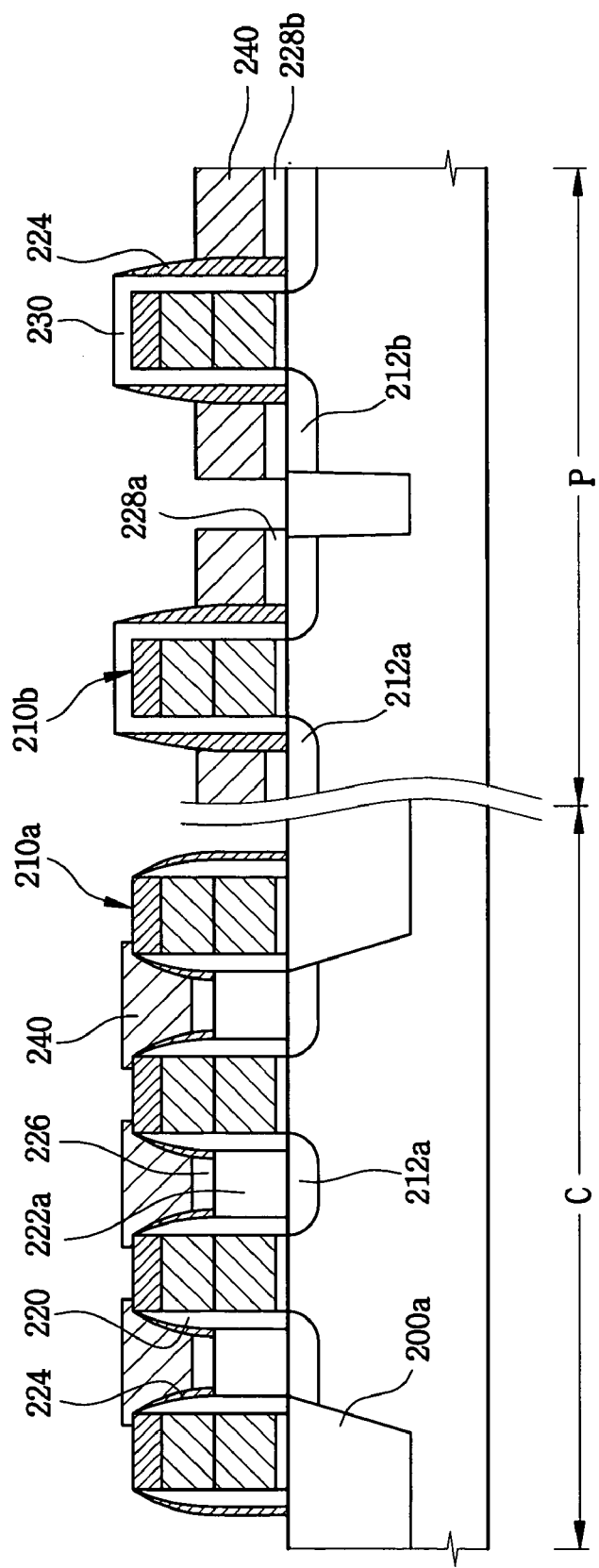
FIG. 8 is a cross-sectional view illustrating semiconductor devices according to further embodiments of the present invention.

FIG. 8 is a cross-sectional view illustrating a semiconductor device according to further embodiments of the present invention.

Referring to FIG. 8, gate structures 210a and 210b are formed on a semiconductor substrate 200 in which an active region and a field region 200a have been defined. The gate structures 210a and 210b may each comprise a gate insulation film pattern, a gate pattern and a hard mask pattern. Source/drain regions 212a and 212b are formed at exposed portions of the substrate 200 that are between the gate structures 210a and 210b by implanting p-type impurities or n-type impurities in accordance with the type of transistors that is to be formed.

The semiconductor substrate 200 is divided into a cell area C and a core/peripheral circuit area P. Cells of the semiconductor device are formed on the cell area C to store predetermined data, and peripheral circuits are formed on the core/peripheral circuit area P to input the data to the cells and/or to output the data from the cells. Generally, in a DRAM device, n-type MOS transistors are formed on the cell area C while n-type and p-type MOS transistors are formed on the core/peripheral circuit area P. Hereinafter, gate structures formed on the cell area C will be referred as cell gate structures 210a, and gate structures formed on the core/peripheral circuit area P will be referred as peripheral gate structures 210b.

First spacers 220 are formed on sidewalls of the cell gate structures 210a. The first spacers 220 may be formed of, for example, silicon oxide and/or silicon nitride. The first spacers 220 may serve to insulate the cell gate structure 210a from contact pads that are formed between adjacent cell gate structures 210. The thickness of the first spacer 220 may be determined based on its insulation characteristic and the contact area of the adjacent contact pad with the substrate 200. The first spacer 220 may have a thickness of, for example, from about 50 Å to about 300 Å.

As shown in FIG. 8, first conductive contact pads 222a are formed on exposed portions of the active region between the cell gate structures 210a. The heights of the first conductive contact pads 222a are lower than the heights of the cell gate structures 210a so as to help prevent generating an electrical short between adjacent first conductive contact pads 222a due to horizontal growth of the semiconductor material of the first conductive contact pads 222a. In certain embodiments of the present invention, the height of each first conductive pad 222a may be between 30 to 60 percent less than the height of the adjacent cell gate structures 210a. Each first conductive contact pad 222a may also be silicon doped with impurities and/or silicon germanium doped with impurities.

As is also shown in FIG. 8, insulation film patterns 230 may be formed on upper faces and sidewalls of the peripheral gate structures 210b. The insulation film pattern 230 may be formed of the same material that is used to form the first spacer 220.

Second spacers 224 may then be formed (1) on the sidewalls of the first spacers 220, (2) on sidewalls of the first conductive contact pads 222a adjacent to the field region 220a, and (3) on sidewalls of the insulation film patterns 230. Each second spacer 224 may be a silicon oxide and/or silicon nitride spacer. Because the second spacers 224 are formed on the sidewalls of the first conductive contact pads 222a, the growth of subsequent conductive contact pads is confined in the horizontal direction when the semiconductor materials are grown using exposed portions of the first conductive contact pads 222a as seeds. The second spacers 224 may have a thickness of, for example, from about 50 Å to about 100 Å.

Second conductive contact pads 226a may then be formed on the first conductive contact pads 222a. The second conductive contact pads 226a may be formed using the same semiconductor materials are used to form the first conductive contact pads 222a (e.g., silicon doped with impurities or silicon germanium doped with impurities).

As shown in FIG. 8, third and fourth conductive contact pads 228a and 228b may also be formed on the core/peripheral circuit area P. The third and fourth conductive contact pads 228a and 228b may, for example, be formed of silicon doped with impurities and/or silicon germanium doped with impurities. The third conductive contact pads 228a are doped with n-type impurities while the fourth conductive contact pads 228b are doped with p-type impurities. The third conductive contact pads 228a are connected to the source/drain regions 212a of the n-type MOS transistors, and the fourth conductive contact pads 228b are connected to the source/drain regions 212b of the p-type MOS transistors. The fourth conductive contact pads 228b have heights lower than those of the peripheral gate structures 210b.

Metal silicide patterns 240 may then be selectively formed on the second, third and fourth conductive contact pads 226, 228a and 228b. Each metal silicide pattern 240 may comprise, for example, a cobalt silicide, titanium silicide and/or nickel silicide pattern.

FIGS. 9A to 9I are cross-sectional views illustrating methods for manufacturing semiconductor devices according to still further embodiments of the present invention.

Referring to FIG. 9A, an active region and a field region 200a are defined on a semiconductor substrate 200 using an isolation process, such as an STI process. The substrate 200 may comprise a single crystalline silicon substrate.

Gate structures 210a and 210b are formed on the substrate 200 where the active region and the field region 200a are defined. The gate structures 210a and 210b include gate oxide film patterns, gate patterns and hard mask patterns 208, respectively. The gate patterns may include polysilicon patterns and metal silicide patterns. The hard mask pattern 208 may, for example, be a silicon nitride pattern. The hard mask pattern 208 may be approximately half the thickness of a conventional hard mask that is used in forming a self-aligned contact pad.

As discussed above, with the conventional methods for forming a self-aligned contact pad, a thick hard mask is necessary to provide a shoulder margin for the contact hole when the contact hole is formed using a self-aligned process. However, in the present embodiments, because a self-aligned contact hole is not required for formation of the contact pad, the shoulder margin of the contact hole is not considered during the formation of the contact pad. Therefore, the hard mask pattern 208 may be much thinner than a conventional hard mask. Accordingly, the height of the gate structures 210a and 210b may be reduced.

As is also shown in FIG. 9A, the semiconductor substrate 200 is divided into a cell area C and a core/peripheral circuit area P. Cells are formed on the cell area C to store predetermined data, and peripheral circuits are formed on the core/peripheral circuit area P to input the data to the cells and/or to output the data from the cells. In embodiments where the device is a general DRAM device, n-type MOS transistors may be formed on the cell area C while n-type and p-type MOS transistors are formed on the core/peripheral circuit area P. Hereinafter, gate structures formed on the cell area C will be referred as cell gate structures 210a, and gate structures formed on the core/peripheral circuit area P will be referred as peripheral gate structures 210b.

Source/drain regions 212a and 212b are formed by implanting impurities into the exposed portions of the substrate 200 between (1) the cell gate structures 210a and (2) the peripheral gate structures 210b, using the cell and peripheral gate structures 210a and 210b as masks. Then, using a selective implantation of n-type impurities, n-type source/drain regions 212a are formed adjacent cell and peripheral gate structures 210a and 210b that will be formed to be n-type MOS transistors. The source/drain regions 212a can be formed through ion implantation process once, twice or more in accordance with characteristics of the n-type MOS transistors. Either before or after the selective implantation of n-type impurities, selective implantation of p-type impurities may be used to form p-type source/drain regions 212b adjacent peripheral gate structures 210b that will be formed to be p-type MOS transistors.

Figure 9B:
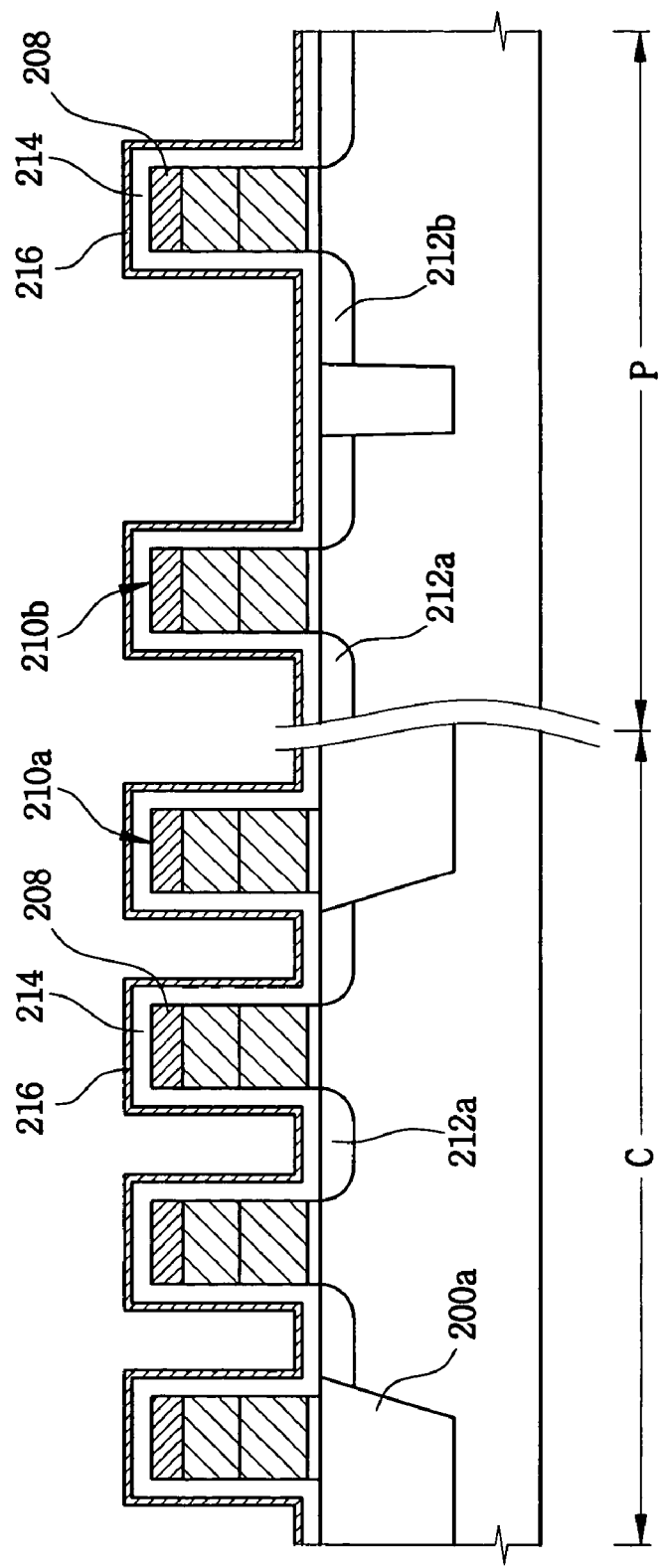

Referring to FIG. 9B, a first insulation film 214 and a second insulation film 216 are successively formed on the semiconductor substrate 200, on the cell gate structures 210a and on the peripheral gate structures 210b. The second insulation film 216 has an etching selectivity relative to the first insulation film 214. For example, the first insulation film 214 may be a silicon oxide film while the second insulation film 216 may be a silicon nitride film, or alternatively, the first insulation film 214 may be a silicon nitride film while the second insulation film may be a silicon oxide film. The description that follows assumes that the first insulation film 214 is a silicon oxide film and that the second insulation film 216 is a silicon nitride film.

Figure 9C:
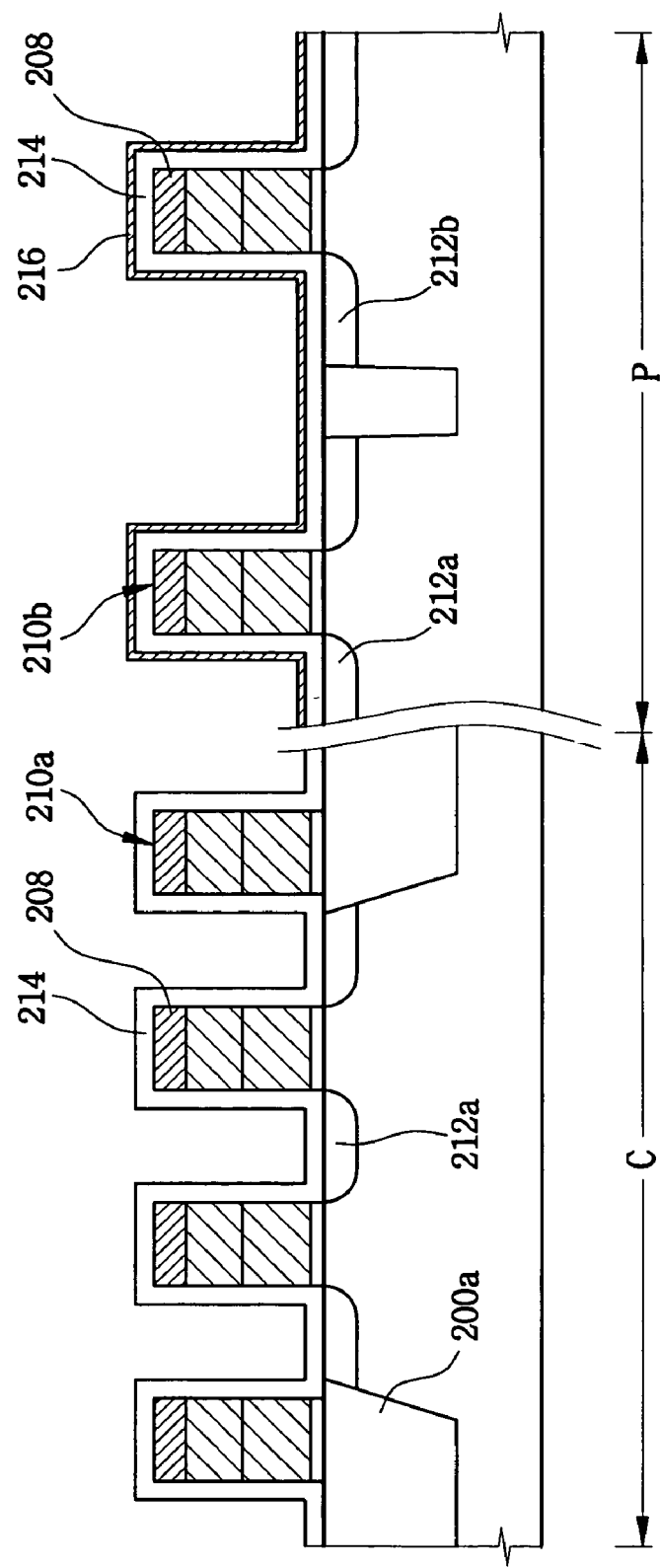

Referring to FIG. 9C, a portion of the second insulation film 216 on the cell area C is selectively etched to leave the second insulation film 216 on the core/peripheral circuit area P only. This may be accomplished, for example, by forming a photoresist pattern (not shown) on the core/peripheral circuit area P and then removing the portion of the second insulation film 216 on the cell area C using a dry etching process or a wet etching process.

Figure 9D:
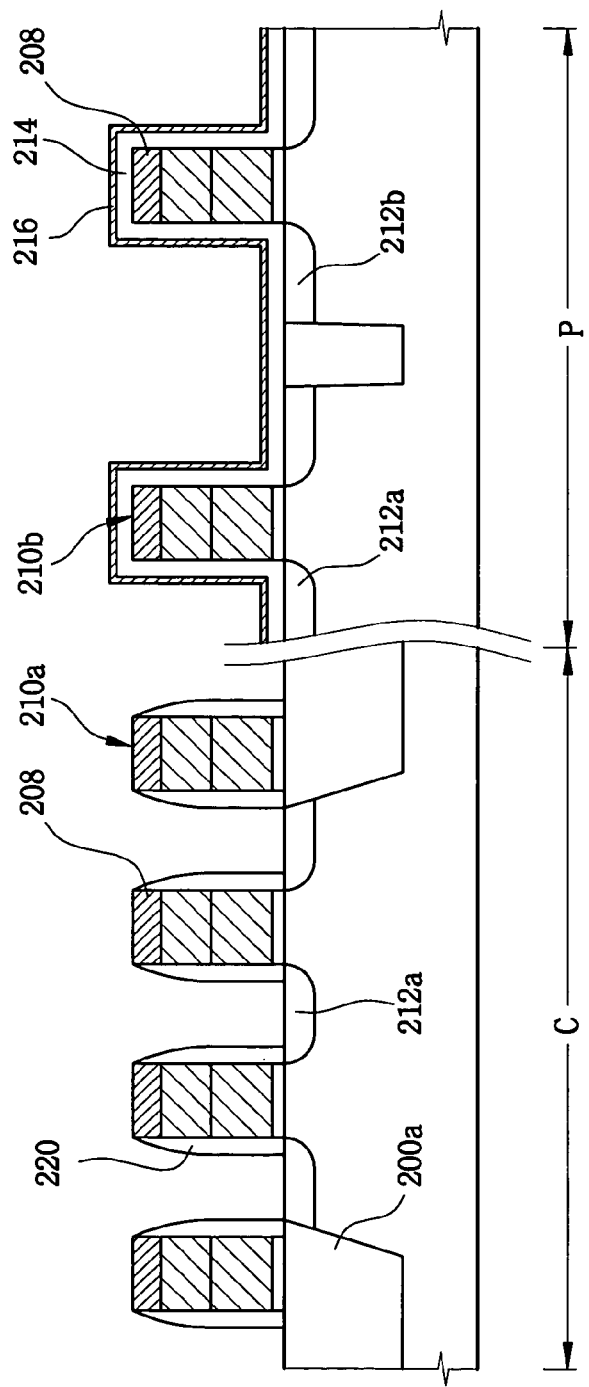

As shown in FIG. 9D, the first insulation film 214 on the cell area C may be selectively and anisotropically etched to form first spacers 220 on sidewalls of the cell gate structures 210a. The first spacers 220 may have a thickness of from about 50 Å to about 300 Å. Because the portion of the second insulation film 216 having the etching selectivity relative to the first insulation film 214 is formed on the core/peripheral circuit area P, the second insulation film 216 is not etched when the first insulation film 214 is anisotropically etched.

Referring to FIG. 9E, first contact pads 222 are formed on the source/drain regions 212a using a semiconductor epitaxial growth process. Each of the first contact pads 222 has a height that is less than the height of the cell gate structures 210a. The first contact pads 222 may be formed of semiconductor materials such as, for example, silicon and/or silicon germanium. Hereinafter, it will be assumed that the semiconductor material of the first contact pads 222 is silicon.

The silicon first contact pads 222 are epitaxially grown on the exposed substrate 200 between the cell gate structures 210a using the single crystalline silicon substrate 200 as a seed. The silicon for the first contact pads 222 may be grown via a UHVCVD process using, for example, a disilane ($Si_2H_6$) gas or a monosilane ($SiH_4$) gas as a source gas. A chlorine ($Cl_2$) gas may be added in order to prevent growth of the silicon relative to the field oxide film of the field region 200a, the nitride hard mask patterns 208, the first spacers 220 and the second insulation film 216.

When the silicon is grown in accordance with the above-described process, the silicon grows in both the vertical and horizontal directions. As such, adjacent first contact pads 222 may grow together, causing an electrical short. When the first contact pads 222 are grown to have a height lower that is lower than the height of the cell gate structures 210a, adjacent first contact pads 222 do not connect to each other and the electrical short is not generated. The height of the first contact pads 222 may be determined based on the integration density of the first contact pads 222 and the height of the cell gate structures 210a. In embodiments of the present invention, the first contact pads 222 have a height lower than the height of the gate structure by about 30 to about 60 percent.

Figure 9F:
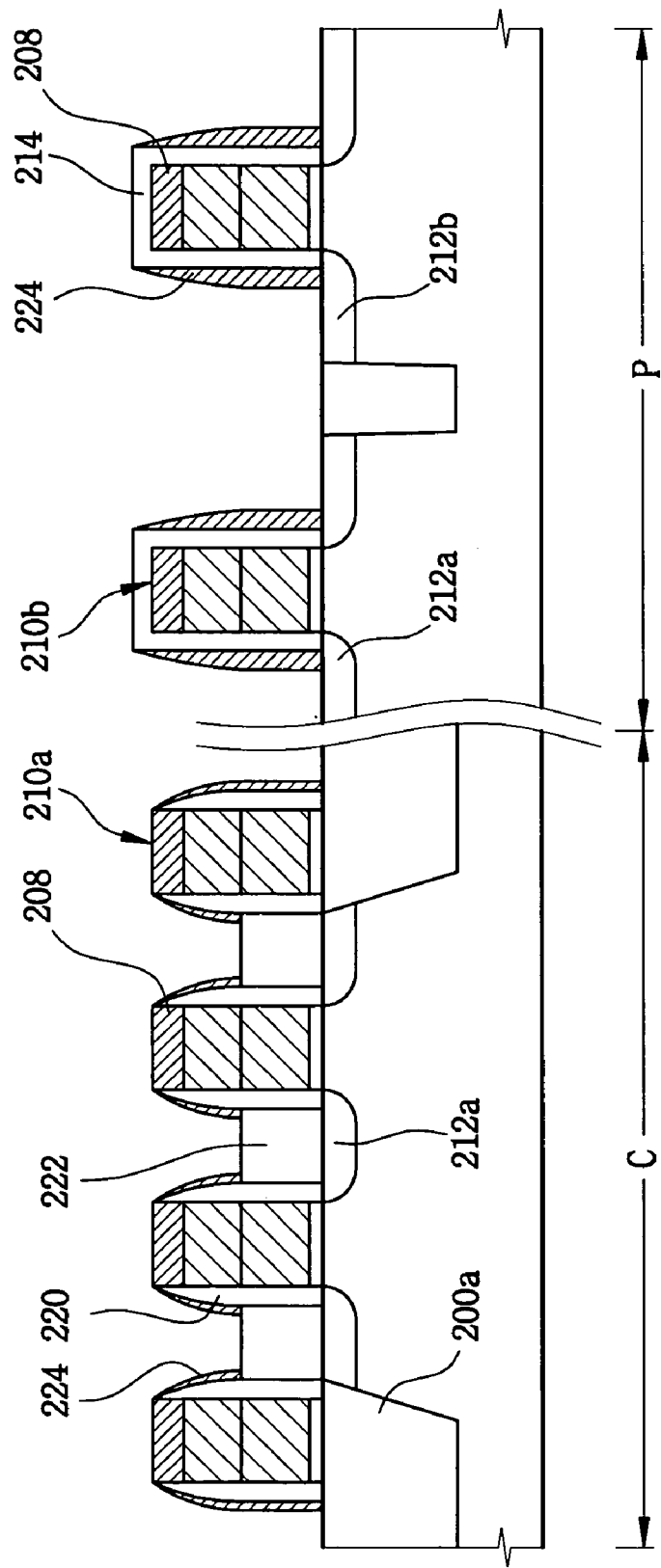

Referring to FIG. 9F, an insulation film is formed on the substrate 200 having the first contact pads 222 formed thereon. The insulation film may have an etching rate similar or identical to the etching rate of the second insulation film 216. The insulation film may be a silicon nitride film. The insulation film may then be anisotropically etched to form second spacers 224 on (1) sidewalls of the first spacers 220, (2) sidewalls of the first contact pads 222 and (3) sidewalls of the peripheral gate structures 210b. When the insulation film is anisotropically etched, the portion of the second insulation film 216 on the core/peripheral circuit area P is also etched at the same time. Then, the first insulation film 214 on the core/peripheral circuit area P may be removed. As a result, the substrate 200 between the gate structures 210b is exposed on the core/peripheral circuit area P.

Because the second spacers 224 are formed on the sidewalls of the first contact pads 222, the semiconductor materials comprising the second contact pads 226 do not grow in the horizontal direction when the second contact pads 226 are grown using the exposed first contact pads 222 as seeds. The second spacers 224 also act to electrically insulate the peripheral gate structures 210b from successively formed contact pads. The second spacers 224 may have a thickness of, for example, from about 50 Å to about 100 Å.

Figure 9G:
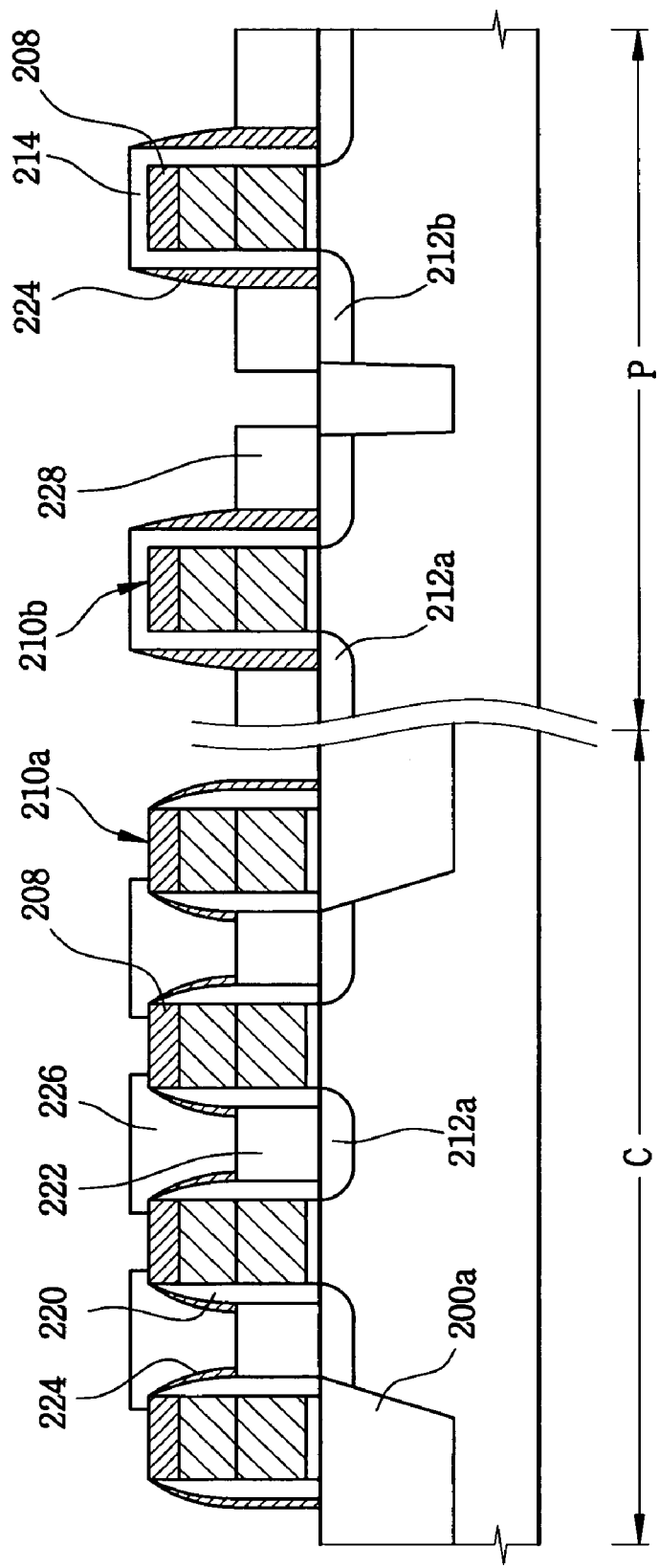

As shown in FIG. 9G, semiconductor materials are grown on the first contact pads 222 and on the exposed portion of the substrate 200 of the core/peripheral circuit area P using a selective epitaxial growth process. In this manner, second contact pads 226 are formed on the first contact pads 222. At the same time, third contact pads 228 are formed in active regions of the core/peripheral circuit area P. The combined height of the first and second contact pads 222 and 226 may be equal to or greater than that of the cell gate structure 210a. Meanwhile, the third contact pads 228 have a height that is lower than the height of the peripheral gate structures 210b.

The second and third contact pads 226 and 228 may be formed of the same semiconductor materials used to form the first contact pads 222. For example, the second and third contact pads 226 and 228 may be silicon and/or silicon germanium contact pads that are epitaxially grown using the first contact pads 222 and the exposed portion of the substrate 200 of the core/peripheral circuit area P as seeds. The process for growing the second and third contact pads 226 and 228 may be identical to the process used to grow the first contact pads 222.

Because the second spacers 224 are positioned on the sidewalls of the first contact pads 222, the second contact pads 226 initially grow on the first contact pads 222 only along the vertical direction using the silicon of the first contact pads 222 as seeds. After the second contact pads 226 have grown somewhat on the first contact pads 222, the second contact pads 226 grow on the first contact pads 222 in the horizontal direction. The horizontal growth rate of the silicon is much lower than the vertical growth rate of the silicon. The horizontal growth of the silicon is confined due to the second spacers 224 so that adjacent contact pads are not connected to each other. As a result, the potential for an electrical short between adjacent contact pads can be reduced and/or minimized.

Additionally, the possibility of electrical shorts forming between adjacent third contact pads 228 (caused by the horizontal growth of the semiconductor materials) may be reduced both because the third contact pads 228 have relatively low heights and because the density of patterns on the core/peripheral circuit area P may be lower than the density of patterns in the cell area C.

Figure 9H:
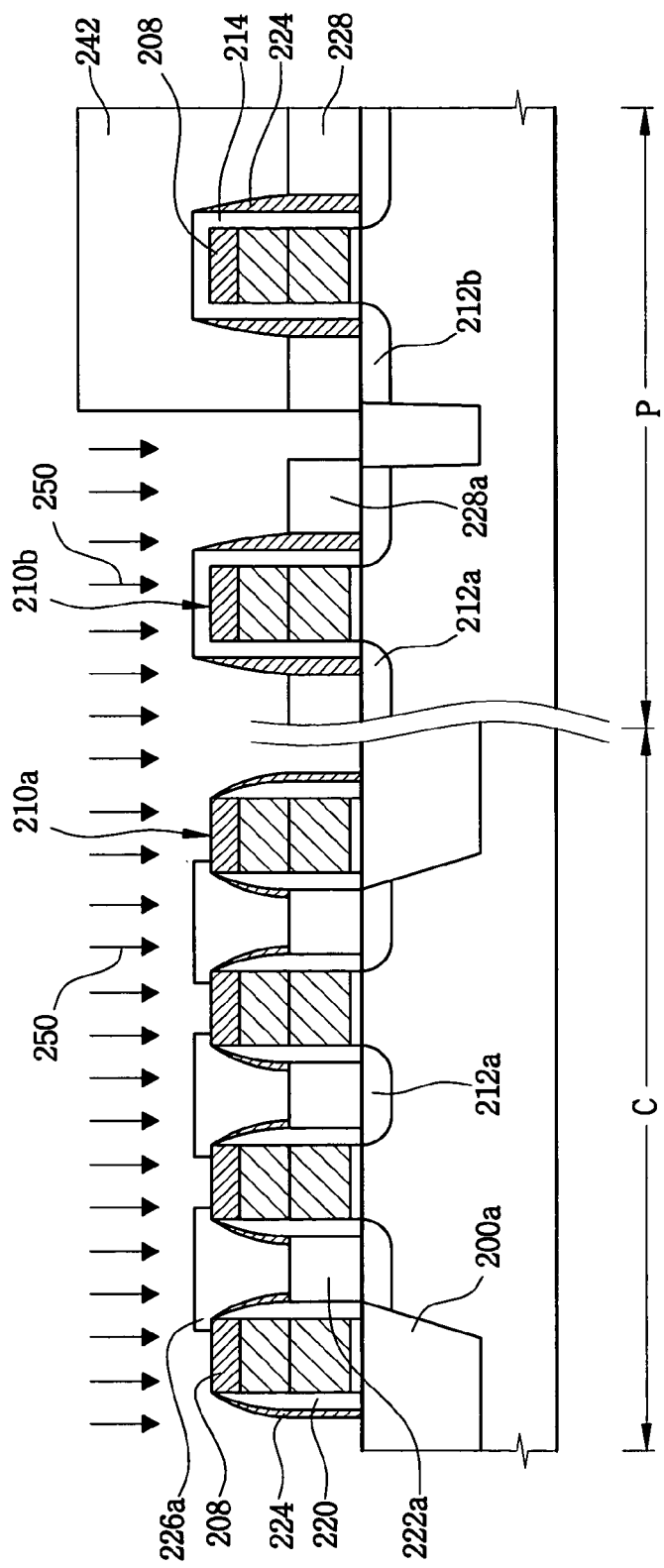

Referring to FIG. 9H, n-type impurities are selectively implanted into the first, second and third contact pads 222, 226 and 228 that will be formed as the n-type transistors. Thus, the first, second and third contact pads 222, 226 and 228 are changed into first, second and third conductive contact pads 222a, 226a, and 228a. This may be accomplished by forming a first photoresist pattern 242 over the substrate 200 to expose portions of the substrate 200 where the n-type transistors are formed, and then implanting the n-type impurities into the first, second and third contact pads 222, 226 and 228 using the first photoresist pattern 242 as a mask. Thereafter, the first photoresist pattern 242 is removed.

Figure 9I:
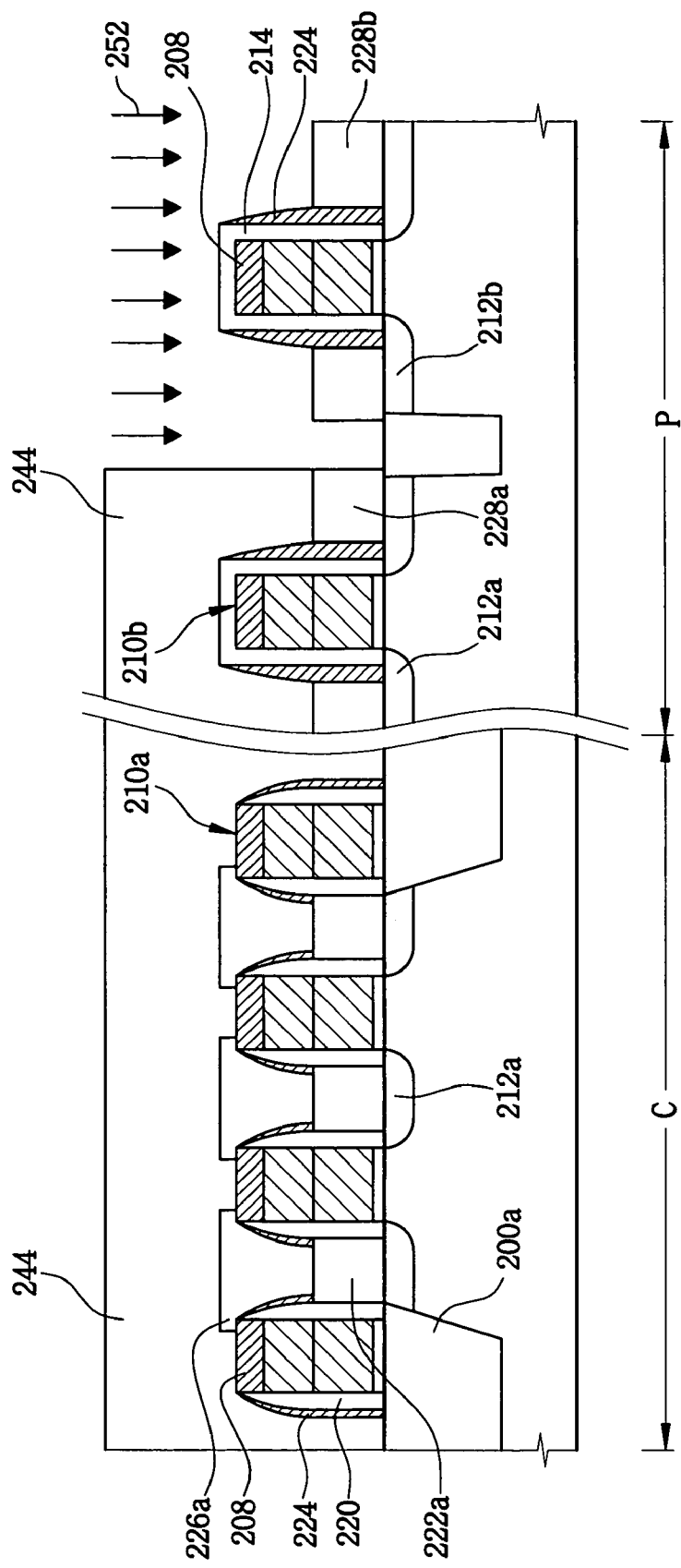

Referring to FIG. 9I, p-type impurities may also be selectively implanted into the third contact pads 228 that will be formed as p-type transistors. These third contact pads 228 are changed into fourth conductive contact pads 228b. This may be accomplished by forming a second photoresist pattern 244 over the substrate 200 to expose portions of the substrate 200 where the p-type transistors are formed, and then implanting the p-type impurities into the third contact pads 228 using the second photoresist pattern 244 as a mask. The second photoresist pattern 244 may then be removed. The p-type impurities can be implanted before the n-type impurities are implanted.

Metal silicide patterns 240 (see FIG. 8) may be formed on the second, third and fourth conductive contact pads 226a, 228a and 228b using any conventional silicidation process. The metal silicide pattern 240 may, for example, be a cobalt silicide, titanium silicide and/or nickel silicide pattern.

According to the above-described methods, the third contact pads 228 that are connected to the source/drain regions on the core/peripheral circuit area P are formed: simultaneously with the second contact pads 226 that are formed in the cell area C. Therefore, depths of the third contact pads 228 can be reduced and resistances of the third contact pads 228 can be also reduced.

According to embodiments of the present invention, the growth of semiconductor contact pads can be reduced and/or minimized in the direction parallel to the substrate when the contact pads are formed using epitaxial growth processes. This can reduce the possibility of an electrical short forming between adjacent contact pads due to the horizontal growth of the contact pads. Embodiments of the present invention can also reduce the possibility of an electrical short between the contact pads and the gate electrodes that may be caused due to an insufficient shoulder margin during the formation of the contact hole for a self-aligned contact.

Additionally, because the gate electrodes of the present invention have heights lower than those of the conventional gate electrodes, the formation of voids in the insulation film between the gate electrodes may be reduced and/or minimized when the insulation film is filled up between the gate electrodes.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A method of manufacturing a semiconductor device comprising:
    forming a pair of gate structures having opposed sidewalls on a semiconductor substrate;
    forming a first spacer on the opposed sidewalls of the pair of gate structures;
    forming a plurality of first contact pads on the substrate between the pair of gate structures, wherein adjacent first contact pads have opposing sidewalls, and wherein the height above the substrate of each first contact pad is less than the height above the substrate of the pair of gate structures;
    forming a second spacer on at least some of the opposing sidewalls of the first contact pads; and
    forming a second contact pad on at least some of the first contact pads.

2. The method of claim 1, wherein the second spacers are further formed between the pair of gate structures and the first contact pads.

3. The method of claim 2, wherein the height of each first contact pad above the substrate is between about 30 percent and about 60 percent of the height above the substrate of the pair of gate structures.

4. The method of claim 1, wherein the height of portions of each second spacer above the substrate is between about 30 percent and about 60 percent of the height above the substrate of the pair of gate structures.

5. The method of claim 2, wherein the First contact pads and the second contact pads comprise semiconductor materials formed using a selective epitaxial growth process.

6. The method of claim 5, wherein the first contact pads comprise contact pads formed of silicon doped with impurities and/or silicon germanium doped with impurities.

7. The method of claim 6, wherein the first contact pads are formed by introducing a dopant gas in-situ during the growth of the first contact pads.

8. The method of claim 2, wherein the first contact pads are formed using an ion implantation process.

9. The method of claim 1, wherein the second contact pads comprise contact pads formed of silicon doped with impurities or silicon germanium doped with impurities.

10. The method of claim 5, wherein the second contact pads are formed by introducing a dopant gas in-situ during the growth of the second contact pads.

11. The method of claim 5, wherein the second contact pads are formed using an ion implantation process.

12. The method of claim 1, wherein the first spacer comprises a silicon oxide and/or silicon nitride film.

13. The method of claim 1, wherein the first spacer has a thickness of from about 50 Å to about 300 Å.

14. The method of claim 1, wherein the second spacer comprises a silicon oxide and/or a silicon nitride spacer.

15. The method of claim 1, wherein the second spacer has a thickness of from about 50 Å to about 100 Å.

16. The method of claim 1, wherein each first contact pad is formed to a predetermined height to prevent horizontal growth of the first contact pads forming an electrical short between one or more adjacent first contact pads.

17. The method of claim 1, further comprising selectively forming a metal silicide layer on the second contact pads.

18. The method of claim 17, wherein the metal suicide layer comprises cobalt silicide, titanium silicide and/or nickel silicide.

19. A method of manufacturing a semiconductor device comprising:
    forming a plurality of cell gate structures and a plurality of peripheral gate structures on a semiconductor substrate having a cell area and a peripheral circuit area in which a plurality of active regions are defined, wherein the cell gate structures have a first height above the substrate;
    forming a first insulation film on the cell gate structures, on the peripheral gate structures and on the semiconductor substrate;
    forming a second insulation film on the first insulation film that has an etching selectivity relative to the first insulation film;
    selectively etching the second insulation film to leave the second insulation film on the peripheral circuit area only;
    selectively etching the first insulation film to form a first spacer on at least one sidewall of each of the cell gate structures;
    forming a plurality of first contact pads having a second height above the substrate on the active region between the cell gate structures, wherein the first height is greater than the second height;
    forming a second contact pad on each of the first contact pads; and
    forming a plurality of third contact pads on the active regions of the peripheral circuit area.

20. The method of claim 19, further comprising forming a second spacer on at least some of the sidewalls of the first contact pads.

21. The method of claim 20, further comprising forming the second spacers on sidewalls of the first spacers and on the second insulation film positioned on the peripheral gate structures.

22. The method of claim 19, wherein the second height is between about 30 percent and about 60 percent of the first height.

23. The method of claim 19, wherein the first contact pads and the second contact pads comprise semiconductor materials formed using a selective epitaxial growth process.

24. The method of claim 19, wherein the first contact pads, the second contact pads and the third contact pads each comprise contact pads formed of silicon doped with impurities and/or silicon germanium doped with impurities.

25. The method of claim 19, wherein one of the first insulation film and the second insulation film comprises a silicon oxide film and the other of the first insulation film and the second insulation film comprises a silicon nitride film.

26. The method of claim 19, wherein the first spacers have a thickness of from about 50 Å to about 300 Å.

27. The method of claim 19, further comprising selectively forming metal silicide layers on the second contact pads and on the third contact pads.

28. The method of claim 27, wherein the metal silicide layers comprise cobalt silicide, titanium silicide and/or nickel silicide.

29. The method of claim 19, wherein each first contact pad is formed to a predetermined height to prevent horizontal growth of the first contact pads creating forming an electrical short between one or more adjacent first contact pads.

30. The method of claim 21, wherein the forming the second spacers further comprises:
    forming a third insulation film on the semiconductor substrate including the first contact pads formed thereon, wherein the third insulation film has a substantially same etching rate as the second insulation film;
    anisotropically etching the third insulation film and the second insulation film on the peripheral circuit area in order to leave the third insulation film on the first spacers positioned on the first contact pads and on the second insulation film formed on the peripheral gate structures; and
    removing the first insulation film from the peripheral circuit area.

31. The method of claim 19, further comprising implanting impurities into the first contact pads and into the third contact pads after forming the second contact pads and the third contact pads.

32. The method of claim 31, wherein implanting impurities further comprises;
    selectively implanting n-type impurities into the first contact pads, into the second contact pads and into the third contact pads connected to source/drain regions of n-type MOS transistors; and
    selectively implanting p-type impurities into the first contact pads, the second contact pads and the third contact pads connected to source/drain regions of p-type MOS transistors.

* * * * *

UNITED STATES PATENT AND TRADEMARK OFFICE
CERTIFICATE OF CORRECTION

PATENT NO. : 7,338,867 B2
APPLICATION NO. : 10/747925
DATED : March 4, 2008
INVENTOR(S) : Lee et al.

It is certified that error appears in the above-identified patent and that said Letters Patent is hereby corrected as shown below:

Column 14, Claim 5, Line 41: Please correct "First"
To read -- first --

Column 15, Claim 18, Line 7: Please correct "metal suicide"
To read -- metal silicide --

Signed and Sealed this

Tenth Day of June, 2008

JON W. DUDAS
*Director of the United States Patent and Trademark Office*